(12) United States Patent
Xie et al.

(10) Patent No.: US 10,854,702 B2
(45) Date of Patent: Dec. 1, 2020

(54) ARRAY SUBSTRATE AND DISPLAY DEVICE

(71) Applicant: Wuhan China Star Optoelectronics Semiconductor Display Technology Co., Ltd., Wuhan (CN)

(72) Inventors: Yan Xie, Wuhan (CN); Jianhong Lin, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 72 days.

(21) Appl. No.: 16/316,049

(22) PCT Filed: Dec. 17, 2018

(86) PCT No.: PCT/CN2018/121605
§ 371 (c)(1),
(2) Date: Jan. 8, 2019

(87) PCT Pub. No.: WO2019/080948
PCT Pub. Date: May 2, 2019

(65) Prior Publication Data
US 2020/0194531 A1      Jun. 18, 2020

(30) Foreign Application Priority Data

Oct. 27, 2017   (CN) .......................... 2017 1 1026720
Sep. 21, 2018   (CN) .......................... 2018 1 1104559

(51) Int. Cl.
*H01L 27/32*      (2006.01)
*H01L 51/00*      (2006.01)

(52) U.S. Cl.
CPC ...... *H01L 27/3276* (2013.01); *H01L 27/3258* (2013.01); *H01L 51/0011* (2013.01); *H01L 51/0097* (2013.01)

(58) Field of Classification Search
CPC ............. H01L 27/3276; H01L 27/3258; H01L 51/0011; H01L 51/0097
USPC ........................................................ 257/40
See application file for complete search history.

(56) References Cited

U.S. PATENT DOCUMENTS

| | | | |
|---|---|---|---|
| 2010/0295048 A1 | 11/2010 | Chung et al. | |
| 2011/0304060 A1 | 12/2011 | Qin et al. | |
| 2013/0307103 A1 | 11/2013 | Lin et al. | |
| 2017/0069701 A1 | 3/2017 | Cai | |
| 2019/0114976 A1* | 4/2019 | Ikeda ...................... | G09G 3/20 |

FOREIGN PATENT DOCUMENTS

| | | |
|---|---|---|
| CN | 101599497 | 12/2009 |
| CN | 102244082 | 11/2011 |
| CN | 102280436 | 12/2011 |
| CN | 104795403 | 7/2015 |

* cited by examiner

*Primary Examiner* — Elias Ullah

(57) ABSTRACT

An array substrate and a display device are provided. The array substrate includes a plurality of first through holes, and a substrate, a first metal layer, an interlayer dielectric layer, and a second metal layer are formed in sequence. The first through holes are defined in the interlayer dielectric layer. The second metal layer is connected to the first metal layer through the first through holes.

14 Claims, 4 Drawing Sheets

ARRAY SUBSTRATE AND DISPLAY DEVICE

RELATED APPLICATIONS

This application is a National Phase of PCT Patent Application No. PCT/CN2018/121605 having International filing date of Dec. 17, 2018, which claims the benefit of priority of Chinese Patent Applications Nos. 201711026720.5 filed on Oct. 27, 2017, and 201811104559.3 filed on Sep. 21, 2018. The contents of the above applications are all incorporated by reference as if fully set forth herein in their entirety.

FIELD AND BACKGROUND OF THE INVENTION

The present invention relates to a display technology field, and particularly to an array display and a display device.

Organic lighting emitting display (OLED) has been widely used in a field of displays and has advantageous performances of self-luminescence, low power consumption, and fast response, etc. A flexible OLED (FOLED) has a substrate made of flexible materials, can be rolled up and folded, and is widely used in mobile phones and television displays.

The OLED can be folded along a direction of data lines or a direction of the scanning lines. Since the scanning lines are made of Mo, and it is easy to result in wire breakage for its poorly ductility.

If the material of the scanning line is changed to Mo/Al/Mo, during an interlayer dielectric (ILD) activate and hydrogenate process, a 400 degree centigrade process is applied, the scanning lines made of Mo/Al/Mo will not be able to withstand the 400 degree centigrade process.

SUMMARY OF THE INVENTION

The application mainly provides an array substrate and a display device to improve a bending resistance of the display device.

The present disclosure provides an array substrate, the array substrate includes a plurality of first through holes and a substrate, a first metal layer, an interlayer dielectric layer and a second metal layer formed in sequence;
the first through holes are defined in the interlayer dielectric layer; and
the second metal layer is connected to first scanning lines formed in the first metal layer through the first through holes, and the first scanning lines are made of molybdenum.

In one embodiment of the present disclosure, the array substrate further includes a plurality of second through holes, a first insulating layer, a second insulating layer, and a third metal layer;
the first insulating layer is formed on the substrate;
the first metal layer is formed on the first insulating layer;
the second insulating layer is formed on the first metal layer and the first insulating layer;
the third metal layer is formed on the second insulating layer;
the interlayer dielectric layer is formed on the third metal layer and the second insulating layer; and
the first through holes are defined in the interlayer dielectric layer and the second insulating layer, the second through holes are defined in the interlayer dielectric layer, and the second metal layer is connected to the third metal layer through the second through holes.

In one embodiment of the present disclosure, the interlayer dielectric layer includes an inorganic insulating layer and an organic filling layer;
the inorganic insulating layer is formed on the third metal layer and the second insulating layer; and
the organic filling layer is formed on the inorganic insulating layer.

In one embodiment of the present disclosure, a plurality of recesses is defined on the array substrate; and
the recesses extend from the inorganic insulating layer to the substrate, and the recesses are filled by organic material to form the organic filling layer.

In one embodiment of the present disclosure, the inorganic insulating layer and the organic filling layer are formed by a same mask process or each of the inorganic insulating layer and the organic filling layer is formed by a mask process.

In one embodiment of the present disclosure, the array substrate further includes a plurality of third through holes, an insulating layer, an organic flat layer, and an anode line layer;
the organic flat layer is formed on the second metal layer;
the anode line layer is formed on the organic flat layer;
the third through holes are defined in the organic flat layer and the second metal layer, and the insulating layer is formed in the third through holes placed at the second metal layer; and
the anode line layer is connected to the first metal layer through the third through holes and the first through holes; the anode line layer is connected to the third metal layer through the third through holes and the second through holes.

The present disclosure provides an array substrate, the array substrate includes a plurality of first through holes and a substrate, a first metal layer, an interlayer dielectric layer and a second metal layer formed in sequence;
the first through holes are defined in the interlayer dielectric layer; and
the second metal layer is connected to the first metal layer through the first through holes.

In one embodiment of the present disclosure, the array substrate further includes a plurality of second through holes, a first insulating layer, a second insulating layer, and a third metal layer;
the first insulating layer is formed on the substrate;
the first metal layer is formed on the first insulating layer;
the second insulating layer is formed on the first metal layer and the first insulating layer;
the third metal layer is formed on the second insulating layer;
the interlayer dielectric layer is formed on the third metal layer and the second insulating layer; and
the first through holes are defined in the interlayer dielectric layer and the second insulating layer, the second through holes are defined in the interlayer dielectric layer, and the second metal layer is connected to the third metal layer through the second through holes.

In one embodiment of the present disclosure, the interlayer dielectric layer includes an inorganic insulating layer and an organic filling layer;
the inorganic insulating layer is formed on the third metal layer and the second insulating layer; and
the organic filling layer is formed on the inorganic insulating layer.

In one embodiment of the present disclosure, a plurality of recesses is defined on the array substrate; and the recesses extend from the inorganic insulating layer to the substrate, and the recesses are filled by organic material to form the organic filling layer.

In one embodiment of the present disclosure, the inorganic insulating layer and the organic filling layer are formed by a same mask process or each of the inorganic insulating layer and the organic filling layer is formed by a mask process.

In one embodiment of the present disclosure, the interlayer dielectric layer includes an inorganic insulating layer; and the inorganic insulating layer is formed on the third metal layer and the second insulating layer.

In one embodiment of the present disclosure, the array substrate further includes a plurality of third through holes, an insulating layer, an organic flat layer, and an anode line layer;

the organic flat layer is formed on the second metal layer;

the anode line layer is formed on the organic flat layer;

the third through holes are defined in the organic flat layer and the second metal layer, and the insulating layer is formed in the third through holes placed at the second metal layer; and the anode line layer is connected to the first metal layer through the third through holes and the first through holes; the anode line layer is connected to the third metal layer through the third through holes and the second through holes.

The present disclosure provides a display device, the display device includes an array substrate:

the array substrate includes a plurality of first through holes and a substrate, a first metal layer, an interlayer dielectric layer and a second metal layer formed in sequence;

the first through holes are defined in the interlayer dielectric layer; and the second metal layer is connected to the first metal layer through the first through holes.

In one embodiment of the present disclosure, the array substrate further includes a plurality of second through holes, a first insulating layer, a second insulating layer, and a third metal layer;

the first insulating layer is formed on the substrate;

the first metal layer is formed on the first insulating layer;

the second insulating layer is formed on the first metal layer and the first insulating layer;

the third metal layer is formed on the second insulating layer;

the interlayer dielectric layer is formed on the third metal layer and the second insulating layer; and the first through holes are defined in the interlayer dielectric layer and the second insulating layer, the second through holes are defined in the interlayer dielectric layer, and the second metal layer is connected to the third metal layer through the second through holes.

In one embodiment of the present disclosure, the interlayer dielectric layer comprises an inorganic insulating layer and an organic filling layer;

the inorganic insulating layer is formed on the third metal layer and the second insulating layer; and the organic filling layer is formed on the inorganic insulating layer.

In one embodiment of the present disclosure, a plurality of recesses is defined on the array substrate; and the recesses extend from the inorganic insulating layer to the substrate, and the recesses are filled by organic material to form the organic filling layer.

In one embodiment, the inorganic insulating layer and the organic filling layer are formed by a same mask process or each of the inorganic insulating layer and the organic filling layer is formed by a mask process.

In one embodiment of the present disclosure, the interlayer dielectric layer includes an inorganic insulating layer; and the inorganic insulating layer is formed on the third metal layer and the second insulating layer.

In one embodiment of the present disclosure, the array substrate further includes a plurality of third through holes, an insulating layer, an organic flat layer, and an anode line layer;

the organic flat layer is formed on the second metal layer;

the anode line layer is formed on the organic flat layer;

the third through holes are defined in the organic flat layer and the second metal layer, and the insulating layer is formed in the third through holes placed at the second metal layer; and the anode line layer is connected to the first metal layer through the third through holes and the first through holes; the anode line layer is connected to the third metal layer through the third through holes and the second through holes.

The beneficial effect of this application is: in the array substrate and the display device of the present invention, the first metal layer is connected to the second metal layer to improve a bending resistance of the display device.

BRIEF DESCRIPTION OF THE SEVERAL VIEWS OF THE DRAWINGS

The accompanying figures to be used in the description of embodiments of the present disclosure will be described to more clearly illustrate the technical solutions of the embodiments, the following details.

DESCRIPTION OF SPECIFIC EMBODIMENTS OF THE INVENTION

Figure 1:
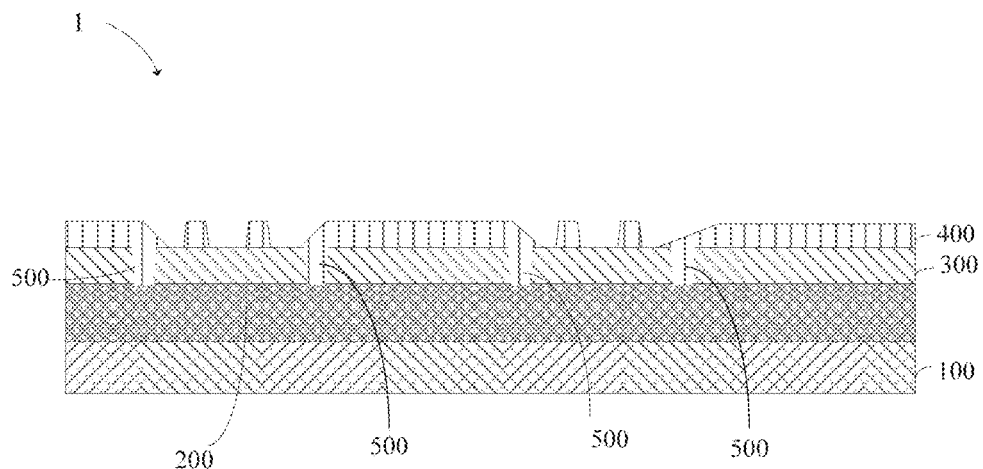
FIG. 1 is a first schematic view of an array substrate of one exemplary embodiment according to the present disclosure.

The description of following embodiment, with reference to the accompanying drawings, is used to exemplify specific embodiments which may be carried out in the present disclosure. Directional terms mentioned in the present disclosure, such as "top", "bottom", "front", "back", "left", "right", "inside", "outside", "side", etc., are only used with reference to the orientation of the accompanying drawings. Therefore, the used directional terms are intended to illustrate, but not to limit, the present disclosure.

In the drawings, the components having similar structures are labeled by same numerals.

The term "embodiment" or "implementation" referred to herein means that a particular feature, structure, or feature described in conjunction with the implementation may be contained in at least one implementation of the present disclosure. The phrase appearing in various places in the specification does not necessarily refer to the same implementation, nor does it refer to an independent or alternative implementation that is mutually exclusive with other implementations. It is expressly and implicitly understood by those skilled in the art that an implementation described herein may be combined with other implementations.

Referring to FIG. 1, FIG. 1 is a first schematic view of an array substrate of one exemplary embodiment according to the present disclosure. The array substrate includes a substrate 100, a first metal layer 200, an interlayer dielectric layer 300, a second metal layer 400 and a plurality of first through holes 500 defined in sequence;

The substrate 100 is formed in sequence by a multi-buffer layer formed on a substrate substrate, a buffer layer made of $SiN_x$ and $SiO_x$, and a polysilicon layer. The substrate substrate is made of a flexible polyimide.

The first metal layer 200 includes a plurality of first scanning lines. The first scanning lines are made of molybdenum with a poor ductility, but it is able to withstand a high temperature manufacturing process of the substrate 100.

The interlayer dielectric layer 300 is formed on the first metal layer 200. The interlayer dielectric layer 300 can include an inorganic insulating layer 310 and an organic filling layer 320. The organic filling layer 320 is formed on the inorganic insulating layer 310. In one embodiment, the interlayer dielectric layer 300 only includes the inorganic insulating layer 310 and excludes the organic filling layer 320, to reduce the number of masks and to reduce production costs.

Figure 2:
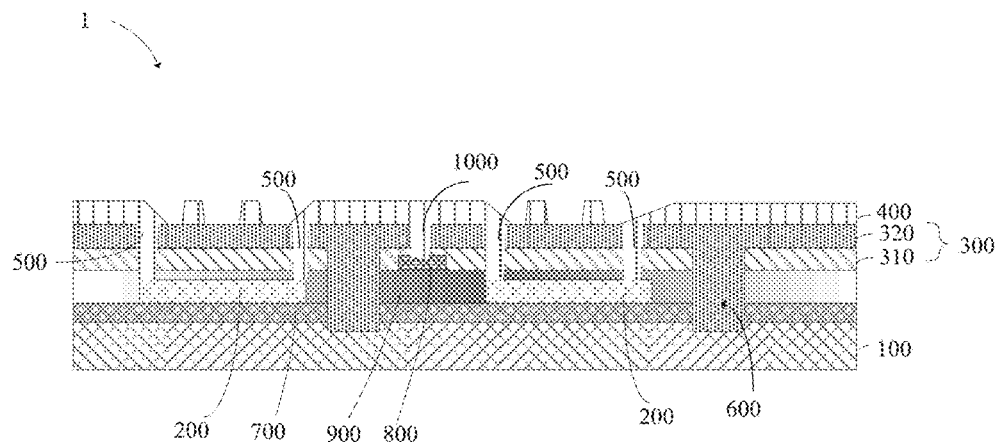
FIG. 2 is a second schematic view of an array substrate of one exemplary embodiment according to the present disclosure.

In one embodiment, referring to FIG. 2, a plurality of recesses 600 is defined in an array substrate 1. The recesses 600 extend from the inorganic insulating layer 310 to the substrate 100. The recesses 600 are filled by organic material. The organic material covers the inorganic insulating layer 310 to form the organic filling layer 320.

During a exposing and etching process of the inorganic insulating layer 310 and the exposure development of the organic filling layer 320, both of them can be formed by a same mask process can be used, or each of them can be formed by a mask process.

Referring to FIG. 1, the second metal layer 400 is formed on the interlayer dielectric layer 300. The second metal layer 400 includes a plurality of source drain electrode lines. The source drain electrode lines are made of Mo/Al/Mo or Ti/Al/Ti with a good ductility.

Referring to FIG. 1, the first through holes 500 are defined in the interlayer dielectric layer 300. The first through holes 500 are connected between the first metal layer 200 and the second metal layer 400. The source drain electrode lines located in the second metal layer 400 are connected to the first scanning lines located in the first metal layer 200 through the first through holes 500 to realize a function of scanning lines together. Because the source drain electrode lines are made of Mo/Al/Mo or Ti/Al/Ti with a good ductility, they are able to improve a bending resistance along a direction of the scanning lines.

In one embodiment, referring to FIG. 2, the array substrate 1 also includes a first insulating layer 700, a third metal layer 800, a second insulating layer 900 and a plurality of second through holes 1000.

Referring to FIG. 2, the first insulating layer 700 is formed on the substrate 100. The first insulating layer 700 is formed and coated by on the polysilicon layer. The first metal layer 200 is formed on the first insulating layer 700. The second insulating layer 900 is formed on the first metal layer 200 and the first insulating layer 700. The third metal layer 800 is formed on the second insulating layer 900. The inorganic insulating layer 310 is formed on the third metal layer 800 and the second insulating layer 900. The third metal layer 800 includes a plurality of second scanning lines. The second scanning lines are made of molybdenum with a poor ductility, but it will be able to withstand a high temperature manufacturing process of the array substrate 100. A pixel capacitor is defined by the first metal layer 200 and the third metal layer 800. The interlayer dielectric layer 300 is formed on the third metal layer 800 and the second insulating layer 900.

Referring to FIG. 2, the first through holes 500 are defined in the interlayer dielectric layer 300 and the second insulating layer 900 to be connected between the first metal layer 200 and the second metal layer 400.

The second through holes 1000 are defined in the interlayer dielectric layer 300. The second metal layer 400 is connected to the third metal layer 800 through the second through holes 1000. The source drain electrode lines located in the second metal layer 400 are connected to the second scanning lines located in the third metal layer 800 through the second through holes 1000 to realize a function of the scanning lines together. Because the source drain electrode lines are made of Mo/Al/Mo or Ti/Al/Ti with a good ductility, they are able to improve a bending resistance along a direction of the scanning lines.

Above all, the source drain electrode lines can connect to either of the first scanning lines or the second scanning lines, or connect to both of them together. The source drain electrode lines include a plurality of first source drain electrode lines and a plurality of second source drain electrode lines. The first source drain electrode lines are connected to the source drain electrode doped portion. The second source drain electrode lines are connected to the first scanning lines and/or the second scanning lines. Although the first source drain electrode lines and the second source electrode lines are formed in the source drain electrode line layer, there is no electricity connection between them, so there is no interaction with each other.

Figure 3:
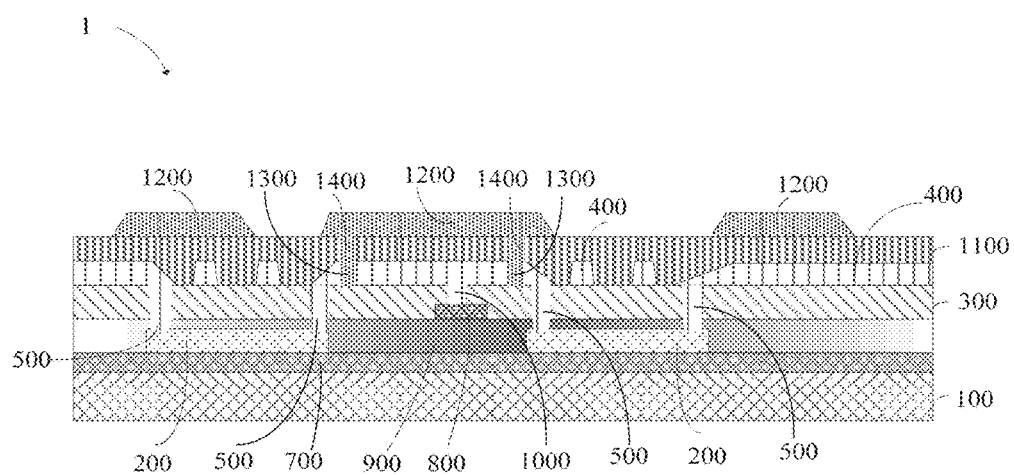
FIG. 3 is thirst schematic view of an array substrate of one exemplary embodiment according to the present disclosure.

In one embodiment, referring to FIG. 3, the array substrate 1 further includes an organic flat layer 1100, an anode line layer 1200, an insulating layer 1300 and a plurality of third through holes 1400. The organic flat layer 1100 is formed on the second metal layer 400. The anode line layer 1200 is formed on the organic flat layer 1100. The anode line layer 1200 includes a plurality of anode lines. The anode lines are made of Ti/Al/Ti with a good ductility.

Referring to FIG. 3, the third through holes 1400 are defined in the organic flat layer 1100 and the second metal layer 400. The second insulating layer 1300 is formed in inner side of the third through holes 1400 placed at the second metal layer 400. The insulating layer 1300 is configured to isolate the metal material of the second metal layer 400 to avoid a short circuit between the lines. Holes can be firstly defined in the second metal layer 400, then the organic material is filled into the holes, and holes are defined in the filling organic material, and finally the remain organic material is defined as the insulating layer 1300.

Above all, the anode line layer 1200 is connected to the first metal layer 200 through the third through holes 1400 and the first through holes 500. The anode lines are connected to the first scanning lines through the third through holes 1400 and the first through holes 500. The anode line layer 1200 is connected to the third metal layer 800 through the third through holes 1400 and the second through holes 1000. The anode lines are connected to the second scanning lines through the third through holes 1400 and the second through holes 1000. Similarly, because the anode lines have a good ductility, the anode lines are connected to the scanning lines to improve a bending resistance along a direction of the scanning lines.

In one embodiment, the array substrate 1 further includes a photo spacer layer and a pixel defining layer. The pixel defining layer is formed on the anode line layer 1200, and the photo spacer layer is formed on the pixel defining layer.

The array substrate 1 of one embodiment of the present disclosure can be applied in a luminous field or a non-luminous field.

Figure 4:
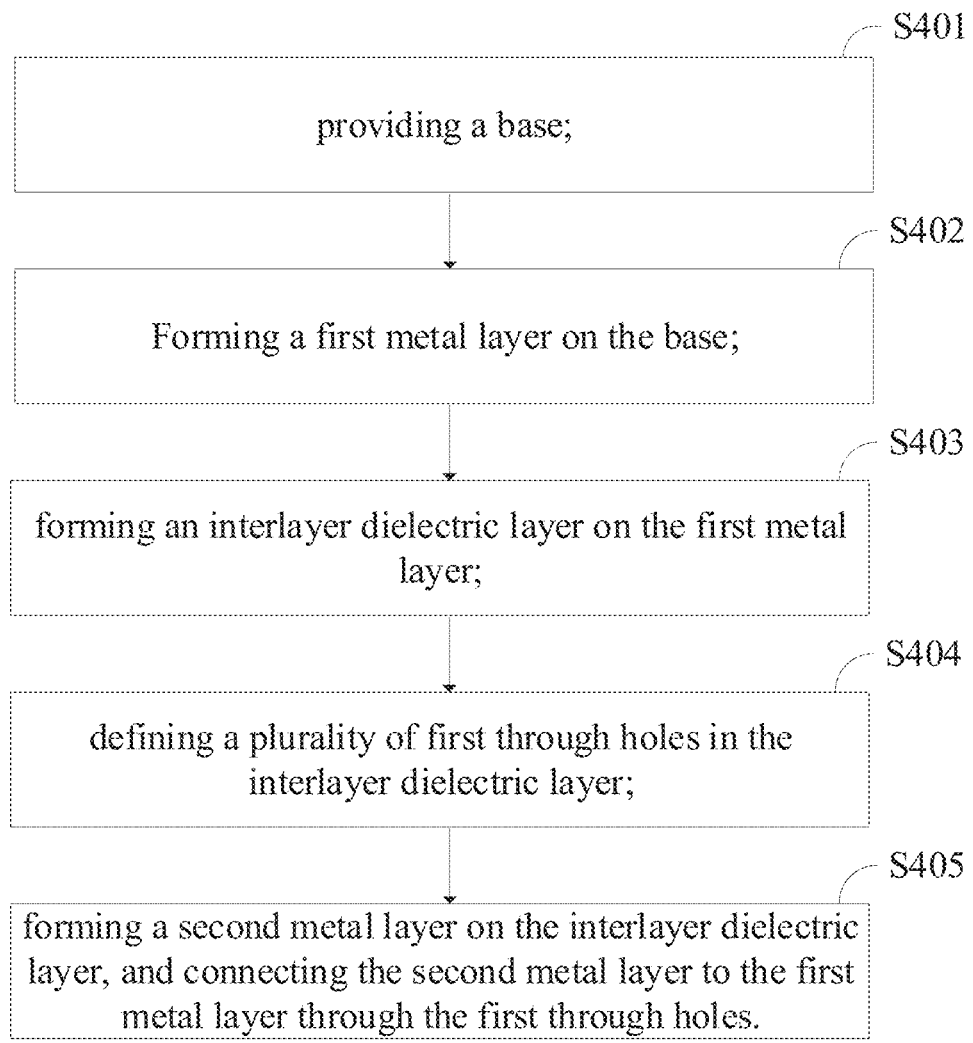
FIG. 4 is a flow chart of a manufacturing method of an array substrate of one exemplary embodiment according to the present disclosure.
Figure 5:
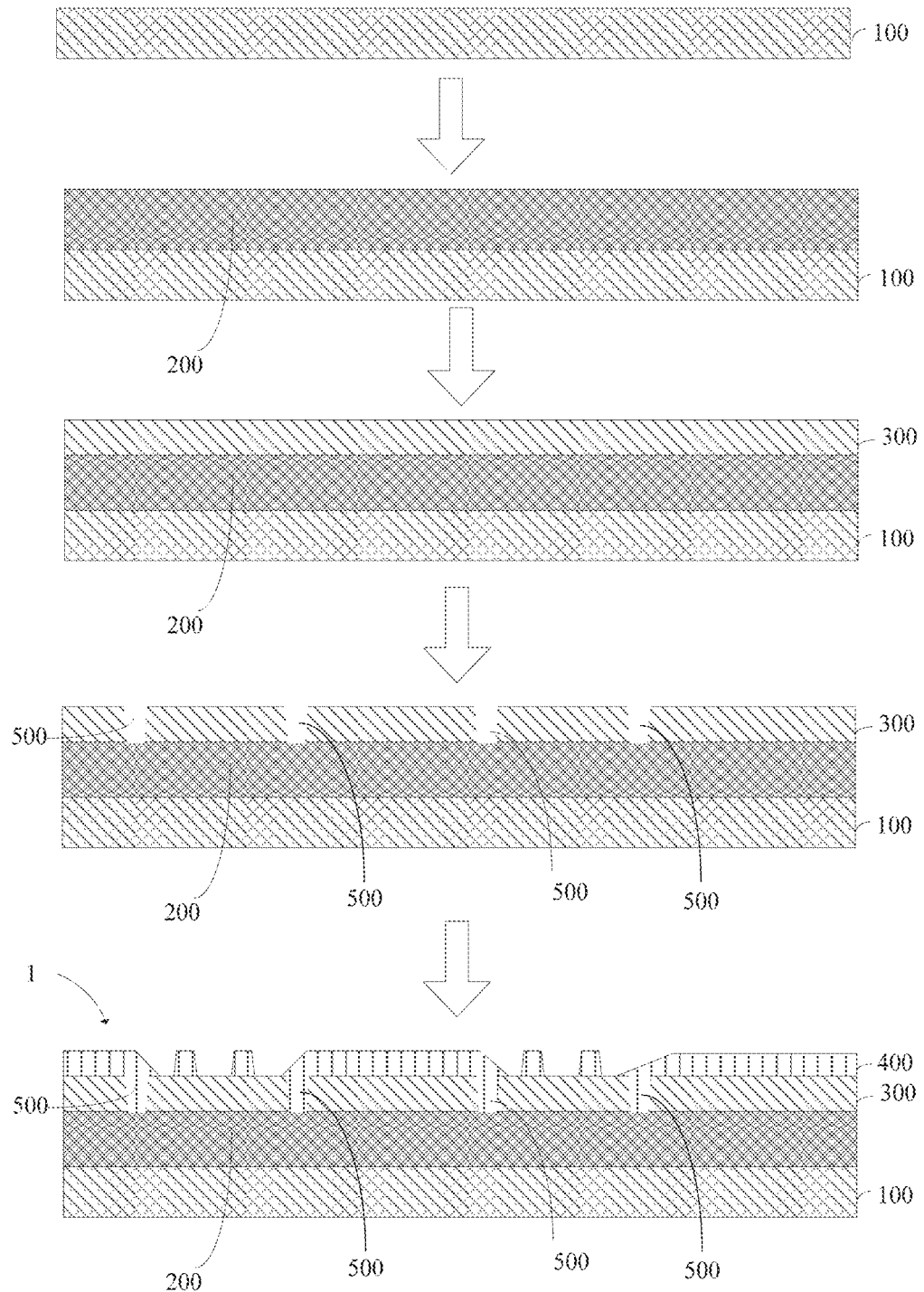
FIG. 5 is a first diagram of a manufacturing method of an array substrate of one exemplary embodiment according to the present disclosure.

Referring to FIG. 4 and FIG. 5, FIG. 4 is a flow chart of a manufacturing method of an array substrate of one exemplary embodiment according to the present disclosure, and FIG. 5 is a first diagram of a manufacturing method of an array substrate of one exemplary embodiment according to the present disclosure. The array substrate 1 is manufactured by following steps:

Step S401, a substrate is provided.

The substrate 100 can be formed in sequence by a multi-buffer layer formed on a substrate substrate, a buffer layer made of $SiN_x$ and $SiO_x$, and a polysilicon layer. The substrate substrate is made of a flexible polyimide.

Step S402, a first metal layer is formed on the substrate.

The first metal layer 200 includes a plurality of first scanning lines. The first scanning lines are made of molybdenum with a poor ductility, but it is able to withstand a high temperature manufacturing process of the substrate 100.

Step S403, an interlayer dielectric layer is formed on the first metal layer.

The interlayer dielectric layer 300 is formed on the first metal layer 200. The interlayer dielectric layer 300 can include an inorganic insulating layer 310 and an organic filling layer 320. The organic filling layer 320 is formed on the inorganic insulating layer 310. In one embodiment, the interlayer dielectric layer 300 only includes the inorganic insulating layer 310 and excludes the organic filling layer 320, to reduce the number of masks and to reduce production costs.

Step S404, a plurality of first through holes is defined in the interlayer dielectric layer.

The first through holes 500 are defined in the interlayer dielectric layer 300. The first through holes 500 are connected between the first metal layer 200 and the second metal layer 400. The source drain electrode lines located in the second metal layer 400 are connected to the first scanning lines located in the first metal layer 200 through the first through holes 500 to realize a function of scanning lines together. Because the source drain electrode lines are made of Mo/Al/Mo or Ti/Al/Ti with a good ductility, they are able to improve a bending resistance along a direction of the scanning lines.

Step S405, a second metal layer is formed on the interlayer dielectric layer, the second metal layer is connected to the first metal layer through the first through holes.

Referring to FIG. 5, the second metal layer 400 is formed on the interlayer dielectric layer 300. The second metal layer 400 includes a plurality of source drain electrode lines. The source drain electrode lines are made of Mo/Al/Mo or Ti/Al/Ti with a good ductility.

Figure 6:
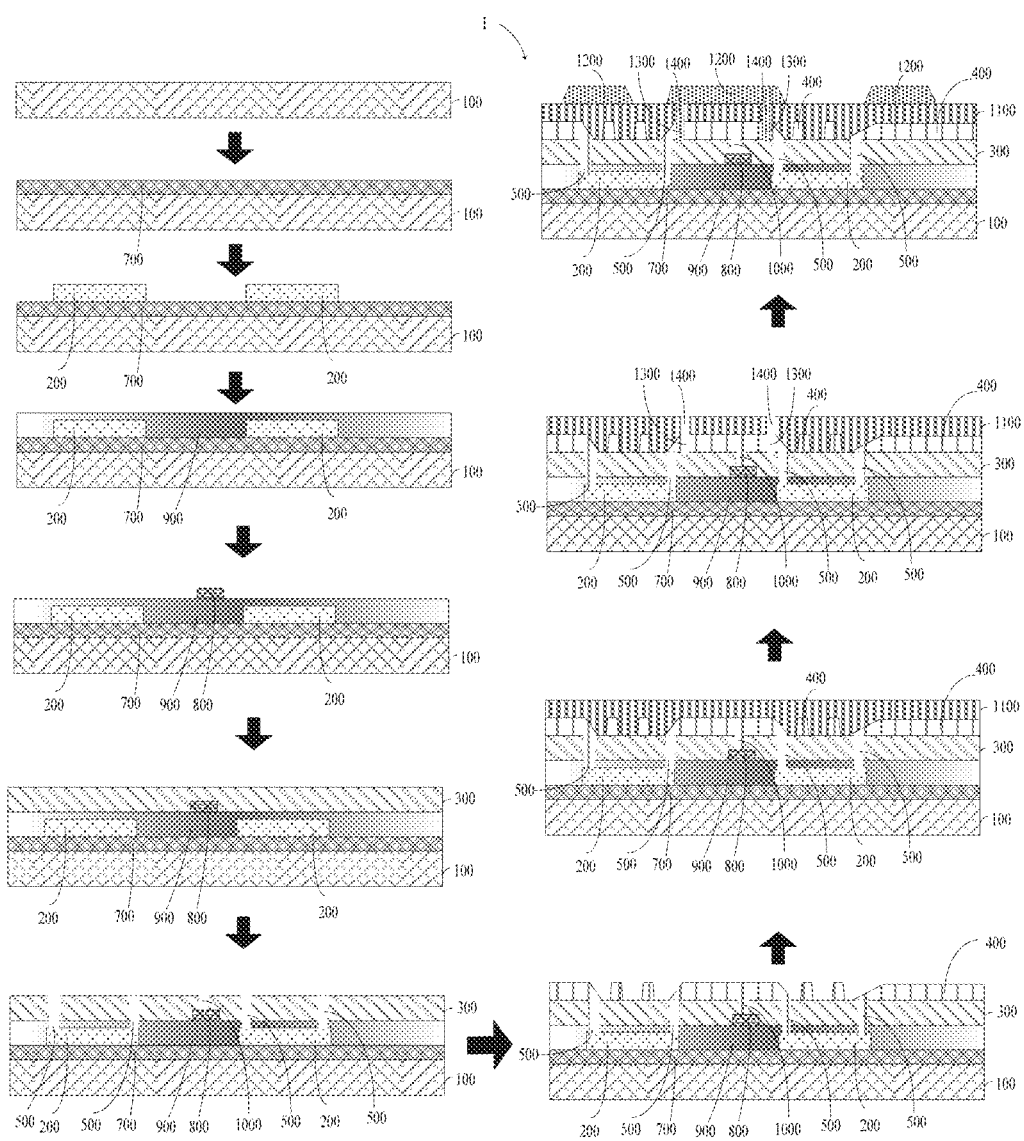
FIG. 6 is a second diagram of a manufacturing method of an array substrate of one exemplary embodiment according to the present disclosure.

In one embodiment, referring to FIG. 6, the first insulating layer 700 is formed on the substrate 100. The first insulating layer 700 is formed and coated by on the polysilicon layer. The first metal layer 200 is formed on the first insulating layer 700. The second insulating layer 900 is formed on the first metal layer 200 and the first insulating layer 700. The third metal layer 800 is formed on the second insulating layer 900. The interlayer dielectric layer 300 is formed on the third metal layer 800 and the second insulating layer 900. The third metal layer 800 includes a plurality of second scanning lines. The second scanning lines are made of molybdenum with a poor ductility, but it will be able to withstand a high temperature manufacturing process of the array substrate 100. A pixel capacitor is defined by the first metal layer 200 and the third metal layer 800.

The first through holes 500 are defined in the interlayer dielectric layer 300 and the second insulating layer 900 to be connected between the first metal layer 200 and the second metal layer 400. The second through holes 1000 are defined in the interlayer dielectric layer 300. The second metal layer 400 is connected to the third metal layer 800 through the second through holes 1000. The source drain electrode lines located in the second metal layer 400 are connected to the second scanning lines located in the third metal layer 800 through the second through holes 1000 to realize a function of the scanning lines together. Because the source drain electrode lines are made of Mo/Al/Mo or Ti/Al/Ti with a good ductility, they are able to improve a bending resistance along a direction of the scanning lines.

Above all, the source drain electrode lines can connect to either of the first scanning lines or the second scanning lines, or connect to both of them together. The source drain electrode lines include a plurality of first source drain electrode lines and a plurality of second source drain electrode lines. The first source drain electrode lines are connected to the source drain electrode doped portion. The second source drain electrode lines are connected to the first scanning lines and/or the second scanning lines. Although the first source drain electrode lines and the second source electrode lines are formed in the source drain electrode line layer, there is no electricity connection between them, so there is no interaction with each other.

In one embodiment, referring to FIG. 6, an organic flat layer 1100 can be formed on the second metal layer 400. An anode line layer 1200 is formed on the organic flat layer 1100. The anode line layer 1200 includes a plurality of anode lines. The anode lines are made of Ti/Al/Ti with a good ductility.

The third through holes 1400 can be defined in the organic flat layer 1100 and the second metal layer 400. The second insulating layer 1300 is formed in inner side of the third through holes 1400 placed at the second metal layer 400. The insulating layer 1300 is configured to isolate the metal material of the second metal layer 400 to avoid a short circuit between the lines. Holes can be firstly defined in the second metal layer 400, then the organic material is filled into the holes, and holes are defined in the filling organic material, and finally the remain organic material is defined as the insulating layer 1300.

Above all, the anode line layer 1200 is connected to the first metal layer 200 through the third through holes 1400 and the first through holes 500. The anode lines are connected to the first scanning lines through the third through holes 1400 and the first through holes 500. The anode line layer 1200 is connected to the third metal layer 800 through the third through holes 1400 and the second through holes 1000. The anode lines are connected to the second scanning lines through the third through holes 1400 and the second through holes 1000. Similarly, because the anode lines have a good ductility, the anode lines are connected to the scanning lines to improve a bending resistance along a direction of the scanning lines.

In one embodiment, the array substrate 1 further includes a photo spacer layer and a pixel defining layer. The pixel defining layer is formed on the anode line layer 1200, and the photo spacer layer is formed on the pixel defining layer.

The array substrate 1 of one embodiment of the present disclosure can be applied in a luminous field or a non-luminous field.

The principle of the display device of the present disclose is the same as that of the above-mentioned array substrate. For details, refer to the principle of the array substrate of the above embodiment, and details are not described herein again.

In the array substrate, the display device and the method for manufacturing the array substrate of the present invention, the scanning lines of the first metal layer are connected to the source drain electrode lines of the second metal layer to improve a bending resistance of the display device along a direction of the scanning lines.

As is understood by a person skilled in the art, the foregoing preferred embodiments of the present disclosure are illustrative rather than limiting of the present disclosure. It is intended that they cover various modifications and similar arrangements be included within the spirit and scope of the present disclosure, the scope of which should be accorded the broadest interpretation so as to encompass all such modifications and similar structures.

What is claimed is:

1. An array substrate, comprising: a plurality of first through holes and a substrate, a first metal layer, an interlayer dielectric layer and a second metal layer formed in sequence;
    wherein the first through holes are defined in the interlayer dielectric layer; and
    the second metal layer is connected to first scanning lines formed in the first metal layer through the first through holes, and the first scanning lines are made of molybdenum;
    wherein the array substrate further comprises a plurality of second through holes, a first insulating layer, a second insulating layer, and a third metal layer;
    the first insulating layer is formed on the substrate;
    the first metal layer is formed on the first insulating layer;
    the second insulating layer is formed on the first metal layer and the first insulating layer;
    the third metal layer is formed on the second insulating layer;
    the interlayer dielectric layer is formed on the third metal layer and the second insulating layer; and
    the first through holes are defined in the interlayer dielectric layer and the second insulating layer, the second through holes are defined in the interlayer dielectric layer, and the second metal layer is connected to the third metal layer through the second through holes;
    wherein the interlayer dielectric layer comprises an inorganic insulating layer and an organic filling layer;
    the inorganic insulating layer is formed on the third metal layer and the second insulating layer; and
    the organic filling layer is formed on the inorganic insulating layer.

2. The array substrate of claim 1, wherein a plurality of recesses is defined on the array substrate; and
    the recesses extend from the inorganic insulating layer to the substrate, and the recesses are filled by organic material to form the organic filling layer.

3. The array substrate of claim 1, wherein the inorganic insulating layer and the organic filling layer are formed by a same mask process or each of the inorganic insulating layer and the organic filling layer is formed by a mask process.

4. The array substrate of claim 1, wherein the array substrate further comprises a plurality of third through holes, an insulating layer, an organic flat layer, and an anode line layer;
    the organic flat layer is formed on the second metal layer;
    the anode line layer is formed on the organic flat layer;
    the third through holes are defined in the organic flat layer and the second metal layer, and the insulating layer is formed in the third through holes placed at the second metal layer; and
    the anode line layer is connected to the first metal layer through the third through holes and the first through holes; the anode line layer is connected to the third metal layer through the third through holes and the second through holes.

5. An array substrate, comprising: a plurality of first through holes and a substrate, a first metal layer, an interlayer dielectric layer and a second metal layer formed in sequence;
    wherein the first through holes are defined in the interlayer dielectric layer; and
    the second metal layer is connected to the first metal layer through the first through holes;
    wherein the array substrate further comprises: a plurality of second through holes, a first insulating layer, a second insulating layer, and a third metal layer;
    the first insulating layer is formed on the substrate;
    the first metal layer is formed on the first insulating layer;
    the second insulating layer is formed on the first metal layer and the first insulating layer;
    the third metal layer is formed on the second insulating layer;
    the interlayer dielectric layer is formed on the third metal layer and the second insulating layer; and
    the first through holes are defined in the interlayer dielectric layer and the second insulating layer, the second through holes are defined in the interlayer dielectric layer, and the second metal layer is connected to the third metal layer through the second through holes;
    wherein the interlayer dielectric layer comprises an inorganic insulating layer and an organic filling layer;
    the inorganic insulating layer is formed on the third metal layer and the second insulating layer; and
    the organic filling layer is formed on the inorganic insulating layer.

6. The array substrate of claim 5, wherein a plurality of recesses is defined on the array substrate;
    the recesses extend from the inorganic insulating layer to the substrate, and the recesses are filled by organic material to form the organic filling layer.

7. The array substrate of the claim 5, wherein the inorganic insulating layer and the organic filling layer are formed by a same mask process or each of the inorganic insulating layer and the organic filling layer is formed by a mask process.

8. The array substrate of claim 5, wherein the interlayer dielectric layer comprises an inorganic insulating layer; and
    the inorganic insulating layer is formed on the third metal layer and the second insulating layer.

9. The array substrate of claim 5, wherein the array substrate further comprises a plurality of third through holes, an insulating layer, an organic flat layer, and an anode line layer;
- the organic flat layer is formed on the second metal layer;
- the anode line layer is formed on the organic flat layer;
- the third through holes are defined in the organic flat layer and the second metal layer, and the insulating layer is formed in the third through holes placed at the second metal layer; and
- the anode line layer is connected to the first metal layer through the third through holes and the first through holes; the anode line layer is connected to the third metal layer through the third through holes and the second through holes.

10. A display device, comprising an array substrate;
- wherein the array substrate comprises a plurality of first through holes and a substrate, a first metal layer, an interlayer dielectric layer and a second metal layer formed in sequence;
- the first through holes are defined in the interlayer dielectric layer; and
- the second metal layer is connected to the first metal layer through the first through holes;
- wherein the array substrate further comprises: a plurality of second through holes, a first insulating layer, a second insulating layer, and a third metal layer;
- the first insulating layer is formed on the substrate;
- the first metal layer is formed on the first insulating layer;
- the second insulating layer is formed on the first metal layer and the first insulating layer;
- the third metal layer is formed on the second insulating layer;
- the interlayer dielectric layer is formed on the third metal layer and the second insulating layer; and
- the first through holes are defined in the interlayer dielectric layer and the second insulating layer, the second through holes are defined in the interlayer dielectric layer, and the second metal layer is connected to the third metal layer through the second through holes;
- wherein the interlayer dielectric layer comprises an inorganic insulating layer and an organic filling layer;
- the inorganic insulating layer is formed on the third metal layer and the second insulating layer; and
- the organic filling layer is formed on the inorganic insulating layer.

11. The display device of claim 10, wherein a plurality of recesses is defined on the array substrate; and
- the recesses extend from the inorganic insulating layer to the substrate, and the recesses are filled by organic material to form the organic filling layer.

12. The display device of claim 10, wherein the inorganic insulating layer and the organic filling layer are formed by a same mask process or each of the inorganic insulating layer and the organic filling layer is formed by a mask process.

13. The display device of claim 10, wherein the interlayer dielectric layer comprises an inorganic insulating layer; and
- the inorganic insulating layer is formed on the third metal layer and the second insulating layer.

14. The display device of claim 10, wherein the array substrate further comprises a plurality of third through holes, an insulating layer, an organic flat layer, and an anode line layer;
- the organic flat layer is formed on the second metal layer;
- the anode line layer is formed on the organic flat layer;
- the third through holes are defined in the organic flat layer and the second metal layer, and the insulating layer is formed in the third through holes placed at the second metal layer;
- the anode line layer is connected to the first metal layer through the third through holes and the first through holes; the anode line layer is connected to the third metal layer through the third through holes and the second through holes.

* * * * *